(12) United States Patent
Bower et al.

(10) Patent No.: US 9,443,883 B2
(45) Date of Patent: Sep. 13, 2016

(54) METHODS OF FORMING PRINTABLE INTEGRATED CIRCUIT DEVICES AND DEVICES FORMED THEREBY

(71) Applicant: Semprius, Inc., Durham, NC (US)

(72) Inventors: Christopher Bower, Raleigh, NC (US); Etienne Menard, Limonges (FR); Matthew Meitl, Durham, NC (US); Joseph Carr, Chapel Hill, NC (US)

(73) Assignee: Semprius, Inc., Durham, NC (US)

( * ) Notice: Subject to any disclaimer, the term of this patent is extended or adjusted under 35 U.S.C. 154(b) by 0 days.

(21) Appl. No.: 14/708,893

(22) Filed: May 11, 2015

(65) Prior Publication Data
US 2015/0380436 A1 Dec. 31, 2015

Related U.S. Application Data

(63) Continuation of application No. 14/334,179, filed on Jul. 17, 2014, now Pat. No. 9,040,425, which is a continuation of application No. 12/732,868, filed on Mar. 26, 2010, now Pat. No. 8,877,648.

(60) Provisional application No. 61/163,535, filed on Mar. 26, 2009.

(51) Int. Cl.
*H01L 29/10* (2006.01)
*H01L 27/12* (2006.01)
*H01L 21/84* (2006.01)
*H01L 21/3065* (2006.01)
(Continued)

(52) U.S. Cl.
CPC ......... *H01L 27/124* (2013.01); *H01L 21/3065* (2013.01); *H01L 21/32055* (2013.01); *H01L 21/76834* (2013.01); *H01L 21/76877* (2013.01); *H01L 21/84* (2013.01); *H01L 27/1214* (2013.01); *H01L 27/1222* (2013.01); *H01L 27/1248* (2013.01); *H01L 27/1266* (2013.01)

(58) Field of Classification Search
CPC ....................................................... H01L 27/12
USPC ............................................................ 257/66
See application file for complete search history.

(56) References Cited

U.S. PATENT DOCUMENTS 5,216,490 A * 6/1993 Greiff ................... B81B 3/0086
257/415
5,258,325 A * 11/1993 Spitzer .................. A61B 3/113
257/E21.614
(Continued)

*Primary Examiner* — Caleb Henry
(74) *Attorney, Agent, or Firm* — Myers Bigel & Sibley, PA

(57) ABSTRACT

Methods of forming integrated circuit devices include forming a sacrificial layer on a handling substrate and forming a semiconductor active layer on the sacrificial layer. The semiconductor active layer and the sacrificial layer may be selectively etched in sequence to define an semiconductor-on-insulator (SOI) substrate, which includes a first portion of the semiconductor active layer. A multi-layer electrical interconnect network may be formed on the SOI substrate. This multi-layer electrical interconnect network may be encapsulated by an inorganic capping layer that contacts an upper surface of the first portion of the semiconductor active layer. The capping layer and the first portion of the semiconductor active layer may be selectively etched to thereby expose the sacrificial layer. The sacrificial layer may be selectively removed from between the first portion of the semiconductor active layer and the handling substrate to thereby define a suspended integrated circuit chip encapsulated by the capping layer.

20 Claims, 12 Drawing Sheets

FIG.

(51) Int. Cl.
  *H01L 21/3205* (2006.01)
  *H01L 21/768* (2006.01)

(56) References Cited

U.S. PATENT DOCUMENTS

| | | | | |
|---|---|---|---|---|
| 5,317,236 A * | 5/1994 | Zavracky | ............... | A61B 3/113 148/DIG. 135 |
| 5,343,064 A * | 8/1994 | Spangler | ............ | B81C 1/00246 257/350 |
| 5,798,283 A * | 8/1998 | Montague | ........... | B81C 1/00246 438/200 |
| 5,827,751 A * | 10/1998 | Nuyen | ................ | H01L 21/6835 257/E21.097 |
| 5,963,788 A * | 10/1999 | Barron | ................ | B81C 1/00246 148/DIG. 105 |
| 5,990,542 A * | 11/1999 | Yamazaki | ............. | G02F 1/1362 257/640 |
| 6,021,675 A * | 2/2000 | Seefeldt | ................. | G01L 1/183 73/721 |
| 6,044,705 A * | 4/2000 | Neukermans | ...... | G01C 19/5719 359/196.1 |
| 6,458,615 B1 * | 10/2002 | Fedder | ................ | B81C 1/00246 216/79 |
| 6,465,280 B1 * | 10/2002 | Martin | ................. | B81B 7/0064 257/417 |
| 6,569,702 B2 * | 5/2003 | Cho | ...................... | B81C 1/0019 257/E21.573 |
| 6,770,506 B2 * | 8/2004 | Gogoi | ................ | B81C 1/00626 216/2 |
| 6,787,051 B2 * | 9/2004 | Silverbrook | ............... | B41J 2/14 216/2 |
| 6,913,941 B2 * | 7/2005 | O'Brien | ............. | B81C 1/00039 438/48 |
| 6,930,366 B2 * | 8/2005 | Kiihamaki | ......... | B81C 1/00047 257/414 |
| 6,930,367 B2 * | 8/2005 | Lutz | ..................... | B81B 3/0005 216/2 |
| 6,952,041 B2 * | 10/2005 | Lutz | ..................... | B81B 3/0054 257/415 |
| 6,960,488 B2 * | 11/2005 | Brosnihan | .......... | B81C 1/00246 438/50 |
| 6,964,894 B2 * | 11/2005 | Wachtmann | ........ | B81C 1/00238 257/446 |
| 7,026,184 B2 * | 4/2006 | Xie | ....................... | B81B 7/0006 438/107 |
| 7,045,381 B1 * | 5/2006 | Lunceford | .......... | B81C 1/00587 257/E21.3 |
| 7,049,164 B2 * | 5/2006 | Bruner | ................ | B81C 1/00246 216/2 |
| 7,060,153 B2 * | 6/2006 | Yamazaki | ........ | H01L 27/1214 156/247 |
| 7,067,067 B2 * | 6/2006 | Silverbrook | ............... | B41J 2/14 216/27 |
| 7,071,109 B2 * | 7/2006 | Novotny | ............ | G02B 26/0841 438/692 |
| 7,074,637 B2 * | 7/2006 | Lutz | ..................... | B81B 3/0005 216/2 |
| 7,083,997 B2 * | 8/2006 | Brosnihan | ......... | B81C 1/00142 438/455 |
| 7,098,065 B2 * | 8/2006 | Chiu | .................. | B81C 1/00333 257/415 |
| 7,115,436 B2 * | 10/2006 | Lutz | ..................... | B81C 1/00269 438/48 |
| 7,138,694 B2 * | 11/2006 | Nunan | ................. | G01P 15/125 257/415 |
| 7,241,638 B2 * | 7/2007 | Funaki | ................. | B81B 3/0021 438/50 |
| 7,250,322 B2 * | 7/2007 | Christenson | ............ | G01P 15/18 257/E21.683 |
| 7,271,076 B2 * | 9/2007 | Yamazaki | ......... | G06K 19/0704 257/E21.568 |
| 7,273,762 B2 * | 9/2007 | Gogoi | ................ | B81C 1/00936 438/50 |
| 7,317,233 B2 * | 1/2008 | Lutz | ..................... | B81B 3/0054 257/254 |
| 7,347,952 B2 * | 3/2008 | Silverbrook | ............... | B41J 2/14 216/27 |
| 7,361,519 B2 * | 4/2008 | Yamazaki | ........... | H01L 21/2022 257/E21.133 |
| 7,364,954 B2 * | 4/2008 | Kuwashima | ...... | H01L 21/67207 257/E21.561 |
| 7,405,099 B2 * | 7/2008 | Gogoi | ................ | G01C 19/5719 257/414 |
| 7,452,786 B2 * | 11/2008 | Dozen | ................. | H01L 37/1214 257/696 |
| 7,462,038 B2 * | 12/2008 | Knoefler | ............... | H01R 13/22 439/66 |
| 7,465,647 B2 * | 12/2008 | Yamazaki | .......... | G06K 19/0704 257/E21.568 |
| 7,465,674 B2 * | 12/2008 | Tamura | ............... | H01L 21/7806 257/E21.038 |
| 7,476,575 B2 * | 1/2009 | Tsurume | ............. | H01L 27/1214 257/E21.535 |
| 7,482,248 B2 * | 1/2009 | Tamura | ............. | H01L 21/31122 438/149 |
| 7,514,760 B1 * | 4/2009 | Quevy | ................ | B81C 1/00246 257/414 |
| 7,541,214 B2 * | 6/2009 | Wan | .................... | B81C 1/00095 438/50 |
| 7,566,640 B2 * | 7/2009 | Yamazaki | ........ | G06K 19/07749 257/E21.237 |
| 7,579,206 B2 * | 8/2009 | Lutz | ..................... | B81B 3/0054 438/118 |
| 7,588,969 B2 * | 9/2009 | Ogita | ................. | H01L 21/7813 257/E21.601 |
| 7,611,965 B2 * | 11/2009 | Suzuki | .................... | H01L 27/12 257/E21.6 |
| 7,645,627 B2 * | 1/2010 | Christenson | ........ | B81C 1/00246 257/E21.001 |
| 7,651,932 B2 * | 1/2010 | Aoki | .................. | H01L 21/6835 438/487 |
| 7,659,150 B1 * | 2/2010 | Monadgemi | ........ | B81C 1/00293 257/E23.193 |
| 7,663,447 B2 * | 2/2010 | Matsuzaki | .......... | H01L 27/1214 331/185 |
| 7,666,698 B2 * | 2/2010 | Zurcher | ............... | B81C 1/00253 257/414 |
| 7,685,706 B2 * | 3/2010 | Maruyama | ............. | H05K 3/205 257/E23.064 |
| 7,728,332 B2 * | 6/2010 | Yamazaki | ........... | H01L 27/1214 257/66 |
| 7,759,256 B2 * | 7/2010 | Wang | .................. | B81C 1/00182 257/E21.17 |
| 7,767,484 B2 * | 8/2010 | Ayazi | ................. | B81C 1/00285 257/E21.613 |
| 7,785,912 B2 * | 8/2010 | Zhan | .................... | B81B 3/0021 257/415 |
| 7,820,529 B2 * | 10/2010 | Tsurume | ............. | H01L 27/1266 257/E21.599 |
| 7,858,423 B2 * | 12/2010 | Siamak | ............... | B81C 1/00246 257/E21.011 |
| 7,862,677 B2 * | 1/2011 | Nakajima | ........... | H01L 27/1214 156/247 |
| 7,863,071 B1 * | 1/2011 | Ivanov | ................ | B81C 1/00246 438/53 |
| 7,868,360 B2 * | 1/2011 | Yamazaki | ............. | G02B 27/017 257/213 |
| 7,879,629 B2 * | 2/2011 | Ko | ....................... | B81C 1/00801 257/E31.11 |
| 7,906,439 B2 * | 3/2011 | Perruchot | ........... | B81C 1/00507 257/E21.115 |
| 7,927,971 B2 * | 4/2011 | Tamura | ................... | H01L 21/84 257/635 |
| 7,943,412 B2 * | 5/2011 | Buchwalter | ........... | B81C 1/0023 257/E23.116 |
| 8,110,442 B2 * | 2/2012 | Jinbo | ................. | H01L 27/1266 438/114 |
| 8,173,471 B2 * | 5/2012 | Hsieh | ................. | B81C 1/00246 257/415 |
| 8,227,876 B2 * | 7/2012 | Nunan | ................. | G01P 15/125 257/414 |
| 8,288,835 B2 * | 10/2012 | Quevy | ................ | B81C 1/00333 257/414 |

(56) References Cited

U.S. PATENT DOCUMENTS

| | | | | |
|---|---|---|---|---|
| 2001/0015256 A1* | 8/2001 | Yamazaki | H01L 27/1214 | 156/289 |
| 2002/0004300 A1* | 1/2002 | Plat | H01L 21/0271 | 438/665 |
| 2002/0117728 A1* | 8/2002 | Brosnihhan | B81C 1/00142 | 257/446 |
| 2003/0117369 A1* | 6/2003 | Spitzer | A61B 3/113 | 345/156 |
| 2003/0148550 A1* | 8/2003 | Volant | H01G 5/40 | 438/52 |
| 2003/0153116 A1* | 8/2003 | Carley | B81B 7/0077 | 438/53 |
| 2004/0048410 A1* | 3/2004 | O'Brien | B81C 1/00039 | 438/52 |
| 2004/0121506 A1* | 6/2004 | Gogoi | B81C 1/00626 | 438/52 |
| 2004/0166688 A1* | 8/2004 | Xie | B81B 7/0006 | 438/706 |
| 2004/0188785 A1* | 9/2004 | Cunningham | B81B 3/0024 | 257/415 |
| 2004/0200281 A1* | 10/2004 | Kenny | B81B 7/0077 | 73/514.33 |
| 2004/0248344 A1* | 12/2004 | Partridge | B81C 1/00333 | 438/127 |
| 2004/0256618 A1* | 12/2004 | Imai | H01L 27/1214 | 257/59 |
| 2005/0048687 A1* | 3/2005 | Tatic-Lucic | H01H 59/0009 | 438/48 |
| 2005/0067633 A1* | 3/2005 | Mushika | B81B 7/0006 | 257/202 |
| 2005/0148121 A1* | 7/2005 | Yamazaki | G06K 19/0704 | 438/149 |
| 2005/0196933 A1* | 9/2005 | Nunan | G01P 15/125 | 438/400 |
| 2005/0260783 A1* | 11/2005 | Lutz | B81B 3/0005 | 438/51 |
| 2006/0003482 A1* | 1/2006 | Chinthakindi | H01G 5/38 | 438/52 |
| 2006/0063309 A1* | 3/2006 | Sugiyama | H01L 21/7806 | 438/118 |
| 2006/0108652 A1* | 5/2006 | Partridge | B81C 1/00333 | 257/414 |
| 2006/0121694 A1* | 6/2006 | Tamura | H01L 21/31122 | 438/458 |
| 2006/0205106 A1* | 9/2006 | Fukuda | B81C 1/00246 | 438/52 |
| 2006/0214248 A1* | 9/2006 | Nunan | G01P 15/125 | 257/419 |
| 2006/0246631 A1* | 11/2006 | Lutz | B81B 3/0005 | 438/127 |
| 2006/0270191 A1* | 11/2006 | Tamura | H01L 21/7806 | 438/458 |
| 2007/0026636 A1* | 2/2007 | Gogoi | G01C 19/5719 | 438/456 |
| 2007/0090474 A1* | 4/2007 | Li | B81B 3/0078 | 257/414 |
| 2007/0161159 A1* | 7/2007 | Yamazaki | G06K 19/07749 | 438/149 |
| 2007/0172976 A1* | 7/2007 | Partridge | B81B 7/007 | 438/53 |
| 2007/0181875 A1* | 8/2007 | Yamazaki | G06K 19/07749 | 257/40 |
| 2007/0212875 A1* | 9/2007 | Tsurume | H01L 27/1214 | 438/637 |
| 2007/0224832 A1* | 9/2007 | Zurcher | B81C 1/00253 | 438/758 |
| 2007/0272992 A1* | 11/2007 | Mori | H01L 27/0629 | 257/416 |
| 2007/0281381 A1* | 12/2007 | Ayazi | B81C 1/00285 | 438/52 |
| 2008/0012126 A1* | 1/2008 | Dozen | B32B 29/00 | 257/729 |
| 2009/0049911 A1* | 2/2009 | Fukuda | B81C 1/00246 | 73/514.32 |
| 2009/0064785 A1* | 3/2009 | Fukuda | B81C 1/00246 | 73/514.32 |
| 2009/0108381 A1* | 4/2009 | Buchwalter | B81C 1/0023 | 257/415 |
| 2009/0275163 A1* | 11/2009 | Lacey | B81C 1/00333 | 438/51 |
| 2009/0317931 A1* | 12/2009 | Perruchot | B81C 1/00238 | 438/50 |
| 2009/0325335 A1* | 12/2009 | Perruchot | B81C 1/00595 | 438/50 |
| 2010/0072561 A1* | 3/2010 | Lee | B81C 1/00182 | 257/415 |
| 2010/0090302 A1* | 4/2010 | Nguyen Hoang | H03H 3/0072 | 257/428 |
| 2010/0213607 A1* | 8/2010 | Smeys | H01L 21/4853 | 257/723 |
| 2010/0276783 A1* | 11/2010 | Cathey | H01L 28/40 | 257/532 |
| 2010/0314668 A1* | 12/2010 | Ollier | B81C 1/00246 | 257/252 |

* cited by examiner

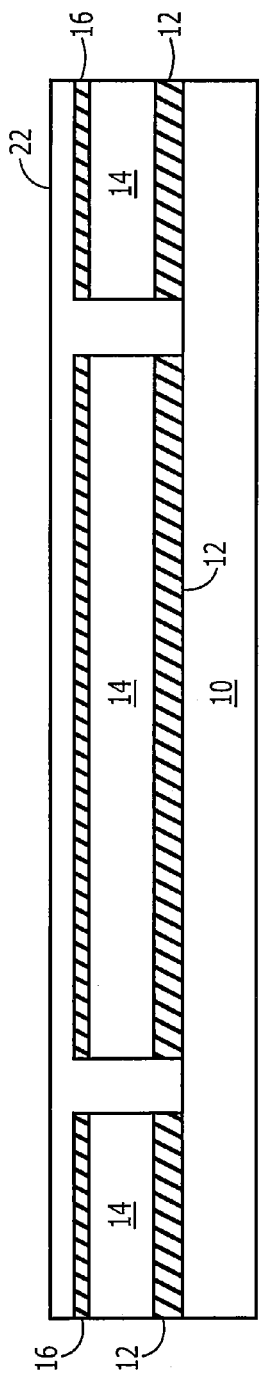
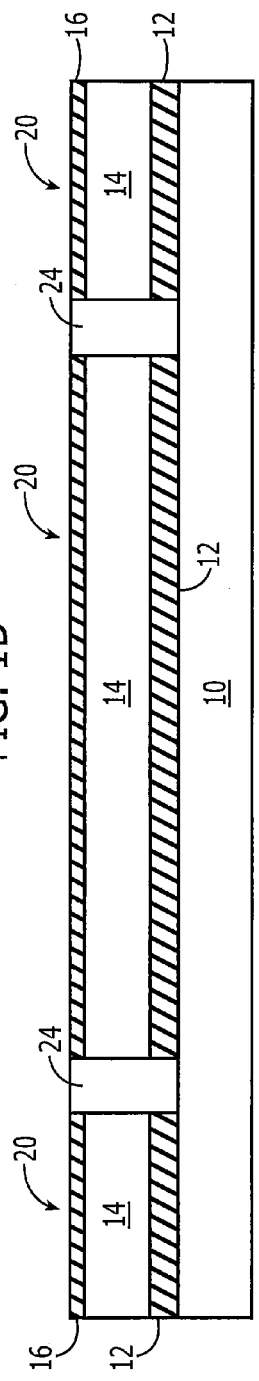
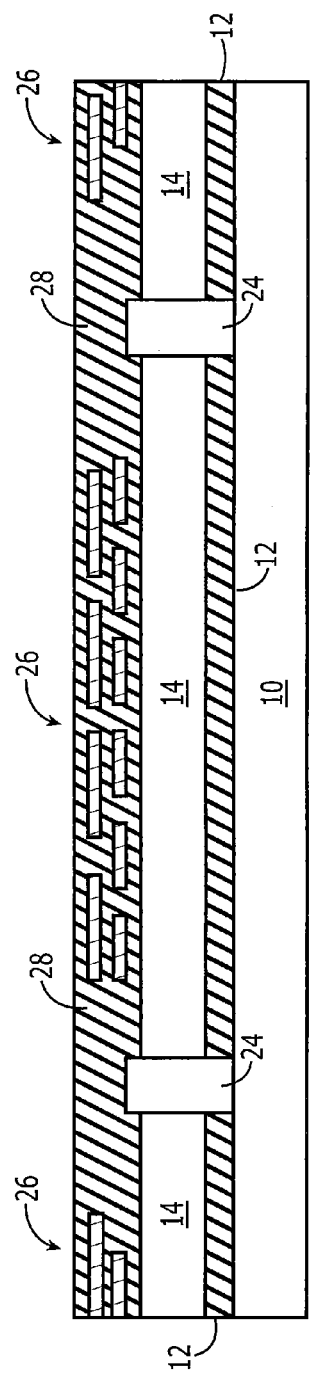
FIG. 1D
FIG. 1E
FIG. 1F

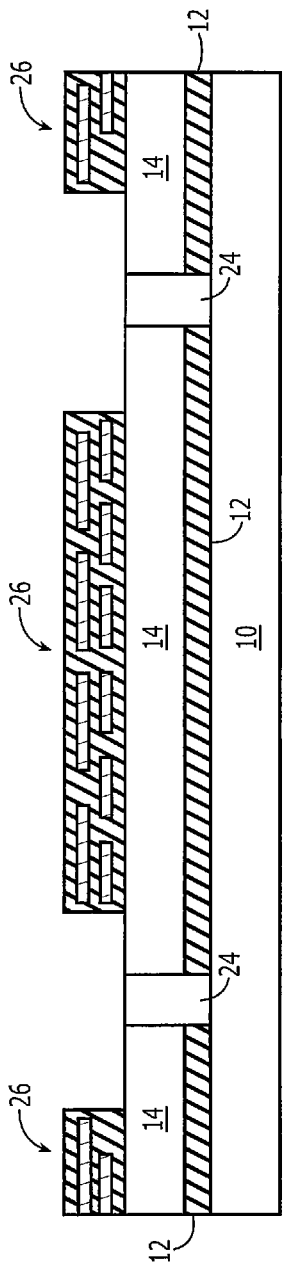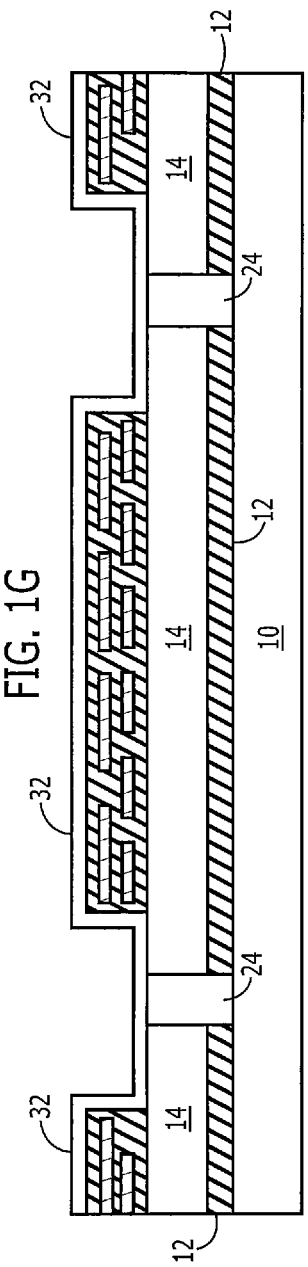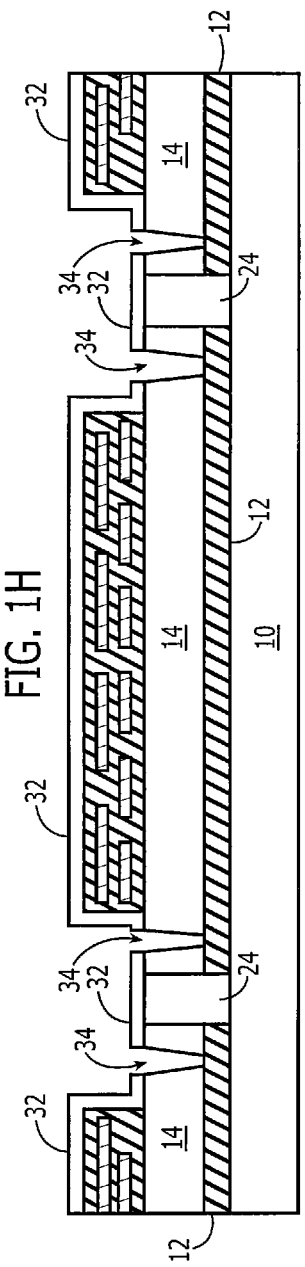
FIG. 1G
FIG. 1H
FIG. 1I

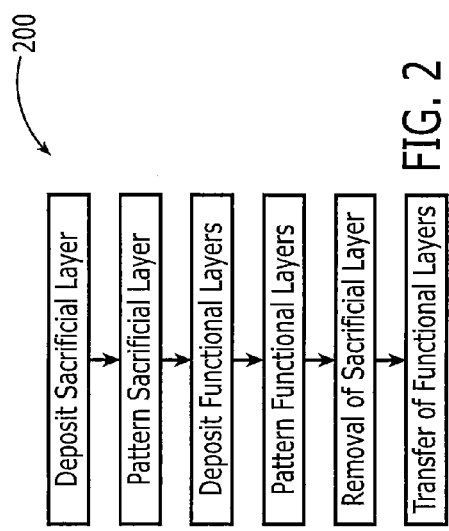
FIG. 2
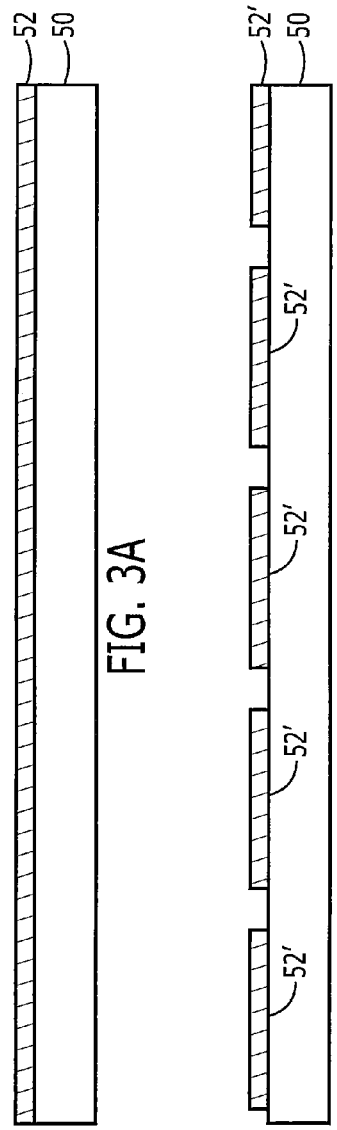
FIG. 3A
FIG. 3B

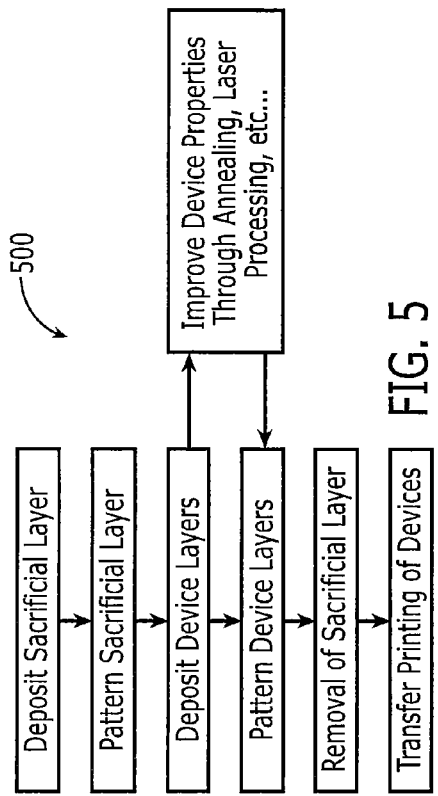
FIG. 5
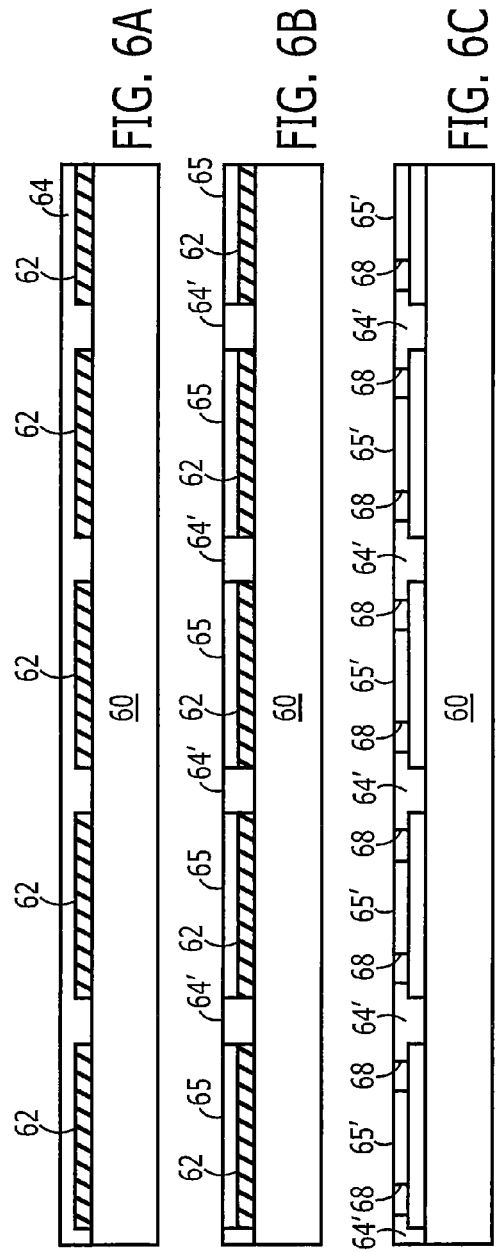
FIG. 6A
FIG. 6B
FIG. 6C

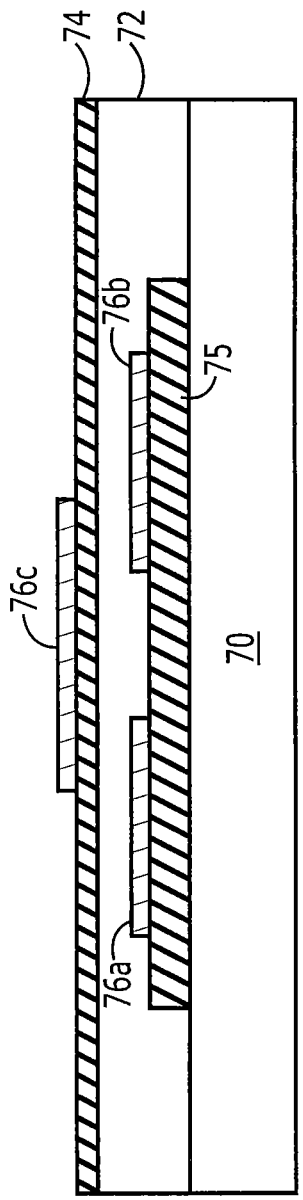
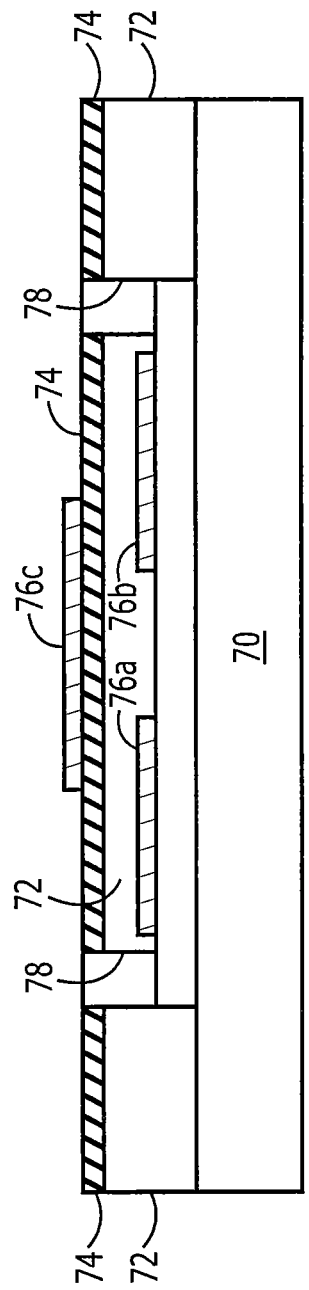
FIG. 7A
FIG. 7B

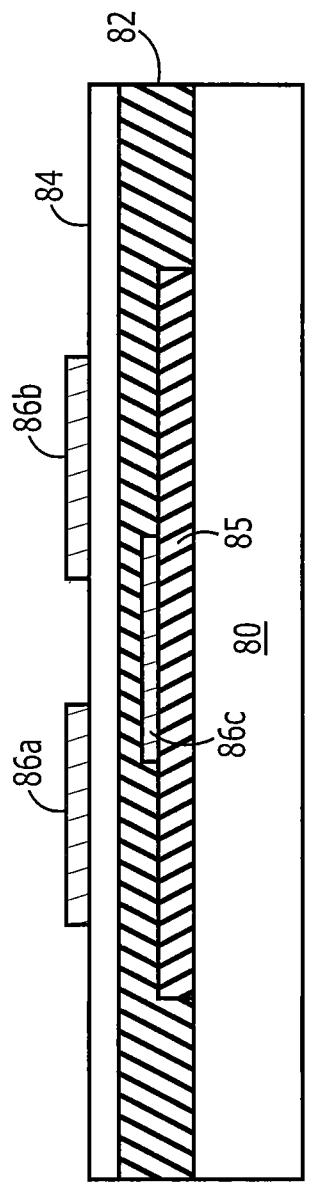
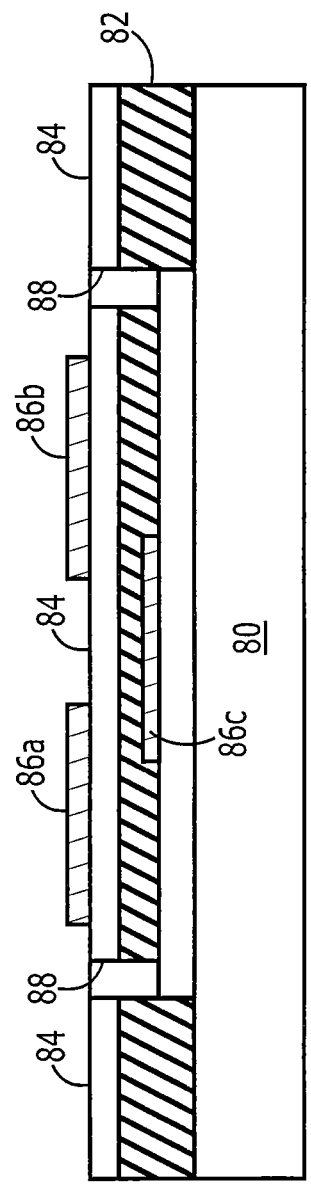
FIG. 8A
FIG. 8B

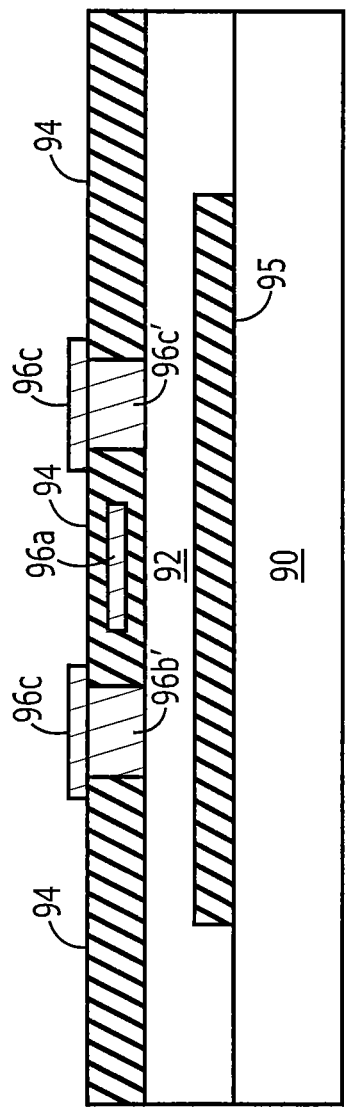
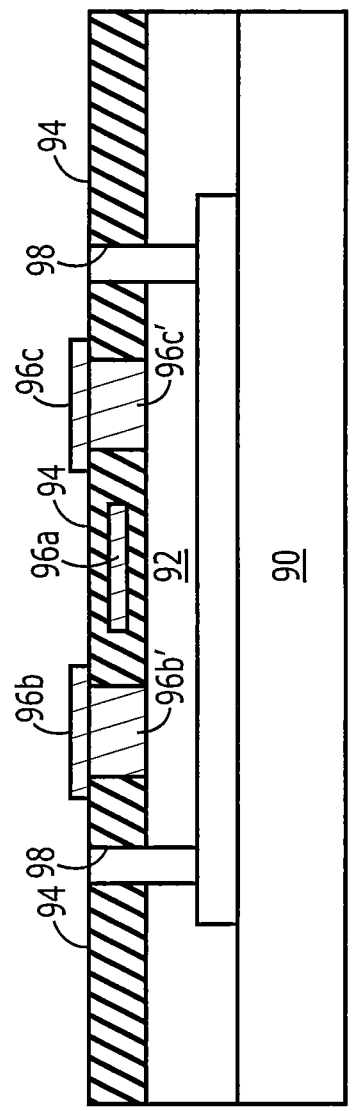
FIG. 9A
FIG. 9B

METHODS OF FORMING PRINTABLE INTEGRATED CIRCUIT DEVICES AND DEVICES FORMED THEREBY

REFERENCE TO PRIORITY APPLICATIONS

This application is a continuation of U.S. patent application Ser. No. 14/334,179, filed on Jul. 17, 2014 which is a continuation of U.S. patent application Ser. No. 12/732,868, filed Mar. 26, 2010, which claims priority from U.S. Provisional Application Ser. No. 61/163,535, filed Mar. 26, 2009, the disclosures of which are hereby incorporated by reference herein in their entireties.

FIELD OF THE INVENTION

The present invention relates to integrated circuit fabrication methods and, more particularly, to methods of forming integrated circuit substrates using semiconductor-on-insulator (SOI) fabrication techniques.

BACKGROUND OF THE INVENTION

A variety of conventional methods are available for printing integrated circuit device structures on substrates. Many of these device structures may include nano structures, microstructures, flexible electronics, and/or a variety of other patterned structures. Some of these device structures are disclosed in U.S. Pat. Nos. 7,195,733 and 7,521,292 and in US Patent Publication Nos. 2007/0032089, 20080108171 and 2009/0199960, the disclosures of which are hereby incorporated herein by reference.

Progress has also been made in extending the electronic performance capabilities of integrated circuit devices on plastic substrates in order to expand their applicability to a wider range of electronic applications. For example, several new thin film transistor (TFT) designs have emerged that are compatible with processing on plastic substrate materials and may exhibit significantly higher device performance characteristics than thin film transistors having amorphous silicon, organic, or hybrid organic-inorganic semiconductor elements. For example, U.S. Pat. No. 7,622,367 to Nuzzo et al. and U.S. Pat. No. 7,557,367 to Rogers et al. disclose methods of forming a wide range of flexible electronic and optoelectronic devices and arrays of devices on substrates containing polymeric materials. The disclosures of U.S. Pat. Nos. 7,557,367 and 7,622,367 are hereby incorporated herein by reference.

SUMMARY OF THE INVENTION

Methods of forming integrated circuit devices according to some embodiments of the invention include forming a sacrificial layer on a handling substrate and forming a semiconductor active layer on the sacrificial layer. A step is performed to selectively etch through the semiconductor active layer and the sacrificial layer in sequence to define a semiconductor-on-insulator (SOI) substrate, which includes a first portion of the semiconductor active layer. The sacrificial layer may be an electrically insulating layer. A multi-layer electrical interconnect network may be formed on the SOI substrate. This multi-layer electrical interconnect network may be encapsulated by an inorganic capping layer that contacts an upper surface of the first portion of the semiconductor active layer. This inorganic capping layer may be formed as an amorphous silicon layer or a metal layer, for example.

The capping layer and the first portion of the semiconductor active layer can be selectively etched to thereby expose the sacrificial layer. The sacrificial layer may then be selectively removed from between the first portion of the semiconductor active layer and the handling substrate to thereby define a suspended integrated circuit chip encapsulated by the capping layer.

According to additional embodiments of the invention, encapsulating the electrical interconnect network may be preceded by roughening the upper surface of the first portion of the semiconductor active layer so that a greater level of adhesion can be achieved between the capping layer and the semiconductor active layer. In some embodiments of the invention, the upper surface may be roughened by exposing the upper surface to a plasma etchant.

According to additional embodiments of the invention, selectively etching through the semiconductor active layer and the sacrificial layer may include selectively etching the semiconductor active layer and the sacrificial layer in sequence to define a trench therein having a bottom that exposes the handling substrate. This trench, which can be a ring-shaped trench that surrounds the SOI substrate, can be filled with an inorganic anchor (e.g., semiconductor anchor) in advance of forming the multi-layer electrical interconnect network. For example, the trench can be filled by depositing a semiconductor layer into the trench and onto the SOI substrate and then planarizing the deposited semiconductor layer to define a semiconductor anchor. In addition, selectively removing the sacrificial insulating layer from between the first portion of the semiconductor active layer and the handling substrate may include exposing a sidewall of the semiconductor anchor.

In additional embodiments of the invention, the multi-layer electrical interconnect network includes a plurality of interlayer dielectric layers, which can be selectively etched to expose the anchor. The encapsulating step may also include depositing the inorganic capping layer directly onto the exposed anchor. In some of these embodiments of the invention, the inorganic capping layer is formed as amorphous silicon and the anchor is formed as polysilicon.

According to additional embodiments of the invention, a method of forming an integrated circuit device may include forming a semiconductor-on-insulator (SOI) substrate anchored at a periphery thereof to an underlying handling substrate. The SOI substrate includes a semiconductor active layer on an underlying sacrificial layer. The methods further include forming a multi-layer electrical interconnect network, which has a plurality of interlayer dielectric layers, on the SOI substrate. A step is performed to selectively etch through the plurality of interlayer dielectric layers to expose an upper surface of the SOI substrate. The multi-layer electrical interconnect network is then encapsulated with an inorganic capping layer (e.g., a-Si), which contacts the exposed upper surface of the SOI substrate. A step is performed to selectively etch through the capping layer and the semiconductor active layer to expose the sacrificial layer. Then, the sacrificial layer is removed from the SOI substrate to thereby suspend the semiconductor active layer from the handling substrate. According to some of these embodiments of the invention, the step of forming a semiconductor-on-insulator (SOI) substrate may include anchoring the SOI substrate to the underlying handling substrate using a ring-shaped polysilicon anchor. In addition, the step of removing the sacrificial layer may include removing the sacrificial layer from the SOI substrate to thereby expose a sidewall of the ring-shaped polysilicon anchor.

Methods of forming substrates according to additional embodiments of the invention include forming a plurality of spaced-apart sacrificial patterns on a first substrate, such as a glass, quartz, ceramic, plastic metal or semiconductor substrate, for example. A semiconductor layer is formed on the plurality of spaced-apart sacrificial patterns and on portions of the first substrate extending between sidewalls of the plurality of spaced-apart sacrificial patterns. The semiconductor layer is patterned to define openings therein. These openings expose respective ones of the plurality of spaced-apart sacrificial patterns. A step is performed to selectively etch the plurality of spaced-apart sacrificial patterns through the openings to thereby convert at least a first portion of the patterned semiconductor layer into a plurality of suspended semiconductor device layers. These suspended semiconductor device layers are anchored to a second portion of the patterned semiconductor layer.

According to additional embodiments of the invention, the step of forming a plurality of spaced-apart sacrificial patterns includes forming a sacrificial layer on the first substrate and then roughening an upper surface of the sacrificial layer. The roughened surface of the sacrificial layer is then selectively etched to define the plurality of spaced-apart sacrificial patterns. In these embodiments of the invention, the step of forming a semiconductor layer includes depositing a semiconductor layer onto the roughened surface of the sacrificial layer. According to some of these embodiments of the invention, the roughening step may include exposing the surface of the sacrificial layer to a chemical etchant prior to cleaning. This sacrificial layer may include a material selected from a group consisting of molybdenum, aluminum, copper, nickel, chromium, tungsten, titanium and alloys thereof. In addition, the semiconductor layer may include a material selected from a group consisting of amorphous silicon, polycrystalline silicon, nanocrystalline silicon, and indium gallium zinc oxide, for example.

According to still further embodiments of the invention, the step of patterning the semiconductor layer includes selectively etching an upper surface of the semiconductor layer to define the openings. This step of selectively etching the upper surface of the semiconductor layer may be followed by printing the plurality of suspended semiconductor device layers onto a second substrate after the plurality of spaced-apart sacrificial patterns have been removed. This printing may be performed by contacting and bonding the upper surface of the semiconductor layer to the second substrate and then fracturing anchors between the plurality of suspended semiconductor device layers and the second portion of the patterned semiconductor layer by removing the first substrate from the second substrate.

Additional embodiments of the invention include printing substrates by forming a plurality of spaced-apart sacrificial patterns on a first substrate and then forming at least one thin-film transistor on each of the plurality of spaced-apart sacrificial patterns. A step is then performed to pattern a semiconductor layer associated with each of the plurality of thin-film transistors to define openings therein that expose respective ones of the plurality of spaced-apart sacrificial patterns. The plurality of spaced-apart sacrificial patterns are then selectively etched through the openings. This selective etching step converts at least a first portion of the patterned semiconductor layer into a plurality of suspended semiconductor device layers, which are anchored to a second portion of the patterned semiconductor layer. Following this step, the plurality of suspended semiconductor device layers are printed (e.g., contact bonded) onto a second substrate. The anchors between the plurality of suspended semiconductor device layers and the second portion of the patterned semiconductor layer are then fractured by removing the first and second substrates from each other. This fracturing step results in the formation of a plurality of separated semiconductor device layers that are bonded to the second substrate.

According to some of these embodiments of the invention, the step of forming at least one thin-film transistor includes forming source and drain electrodes of a first thin-film transistor on a first sacrificial pattern. An amorphous semiconductor layer is then formed on upper surfaces of the source and drain electrodes and on sidewalls of the first sacrificial pattern. An electrically insulating layer is then formed on the amorphous semiconductor layer and a gate electrode of the first thin-film transistor is formed on the electrically insulating layer.

According to alternative embodiments of the invention, the step of forming at least one thin-film transistor includes forming a gate electrode of a first thin-film transistor on a first sacrificial pattern and then forming an electrically insulating layer on the gate electrode and on sidewalls of the first sacrificial pattern. An amorphous semiconductor layer is formed on the electrically insulating layer and source and drain electrodes of the first thin-film transistor are formed on the amorphous semiconductor layer.

Additional embodiments of the invention include forming an array of suspended substrates by forming a plurality of spaced-apart sacrificial patterns on a first substrate. An amorphous semiconductor layer is formed on the plurality of spaced-apart sacrificial patterns and on portions of the first substrate extending between sidewalls of the plurality of spaced-apart sacrificial patterns. Portions of the amorphous semiconductor layer extending opposite the plurality of spaced-apart sacrificial patterns are then converted into respective semiconductor regions having higher degrees of crystallinity therein relative to the amorphous semiconductor layer. The amorphous semiconductor layer is patterned to define openings therein that expose respective ones of the plurality of spaced-apart sacrificial patterns. A step is then performed to selectively etch the plurality of spaced-apart sacrificial patterns through the openings to thereby convert at least a first portion of the patterned amorphous semiconductor layer into a plurality of suspended semiconductor device layers, which are anchored to a second portion of the patterned amorphous semiconductor layer. According to some embodiments of the invention, the converting step includes annealing the portions of the amorphous semiconductor layer extending opposite the plurality of spaced-apart sacrificial patterns. Alternatively, the converting step may include selectively exposing the portions of the amorphous semiconductor layer extending opposite the plurality of spaced-apart sacrificial patterns to laser light.

According to still further embodiments of the invention, the step of forming a plurality of spaced-apart sacrificial patterns includes forming a sacrificial layer on the first substrate and then roughening a surface of the sacrificial layer. A step is then performed to selectively etch the roughened surface of the sacrificial layer to define the plurality of spaced-apart sacrificial patterns. The step of forming an amorphous semiconductor layer includes depositing an amorphous semiconductor layer on the roughened surface of the sacrificial layer. The roughening step may include exposing the surface of the sacrificial layer to a chemical etchant prior to cleaning.

BRIEF DESCRIPTION OF THE DRAWINGS

FIGS. 1A-1J are cross-sectional views of intermediate structures that illustrate methods of forming integrated circuit chips according to embodiments of the present invention.

FIG. 2 is a flow diagram that illustrates fabrication methods according to some embodiments of the invention.

FIGS. 3A-3E are cross-sectional views of intermediate structures that illustrate methods of forming substrates according to embodiments of the invention.

FIG. 5 is a flow diagram that illustrates fabrication methods according to some embodiments of the invention.

FIGS. 6A-6C are cross-sectional views of intermediate structures that illustrate methods of forming substrates according to embodiments of the invention.

FIGS. 7A-7B are cross-sectional views of intermediate structures that illustrate methods of forming TFT transistors according to embodiments of the present invention.

FIGS. 8A-8B are cross-sectional views of intermediate structures that illustrate methods of forming TFT transistors according to embodiments of the present invention.

FIGS. 9A-9B are cross-sectional views of intermediate structures that illustrate methods of forming TFT transistors according to embodiments of the present invention.

DESCRIPTION OF EMBODIMENTS

Figure 1A:
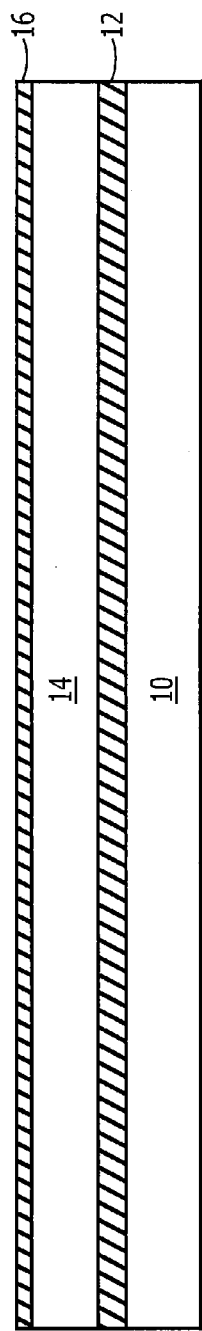

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A illustrates forming an integrated circuit device by forming a sacrificial layer 12 on a handling substrate 10 (e.g., silicon wafer), forming a semiconductor active layer 14 on the sacrificial layer 12 and forming a field oxide layer 16 on the semiconductor active layer 14. According to some embodiments of the invention, the semiconductor active layer 14 may be a thinned silicon wafer that is bonded to the sacrificial layer 12 and the sacrificial layer may be an electrically insulating layer.

Figure 1B:
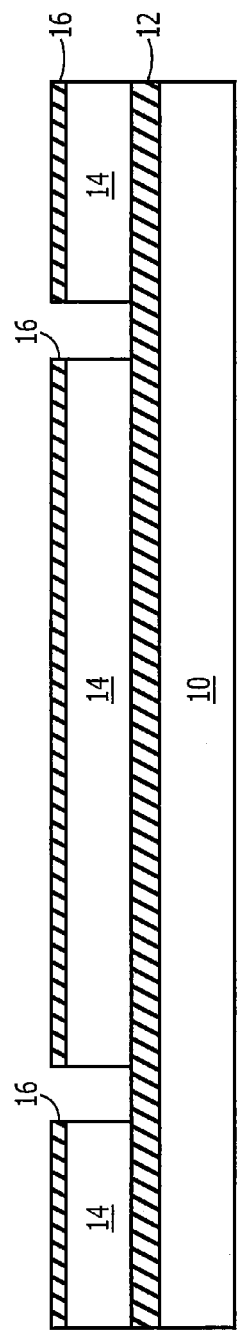
Figure 1C:
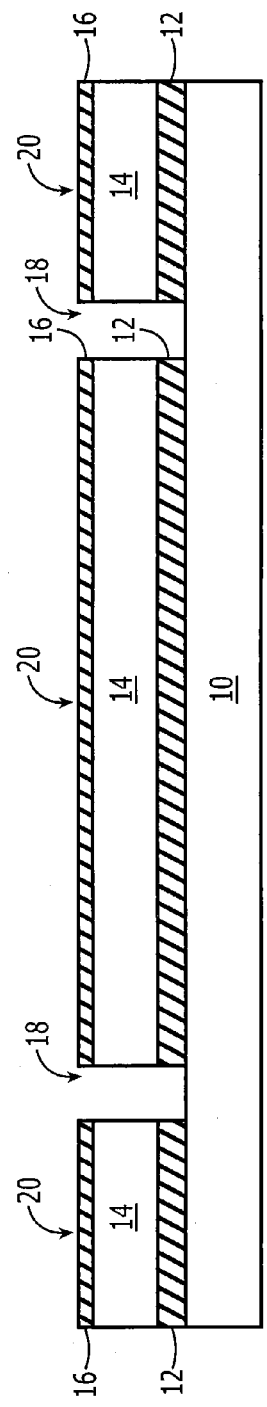

FIGS. 1B-1C illustrate selectively etching through the field oxide layer 16, the semiconductor active layer 14 and the sacrificial layer 12 in sequence to define trenches 18 therein that expose the handling substrate 10 and define a plurality of semiconductor-on-insulator (SOI) substrates 20 containing respective portions of the semiconductor active layer 14.

FIG. 1D-1E illustrate filling the trenches 18 with inorganic anchors 24 (e.g., semiconductor anchors) by depositing an inorganic layer 22 into the trenches 18 and onto the SOI substrates 20 and then planarizing the deposited inorganic layer 22 to define the anchors 24, using the field oxide layer 16 as a etch/planarization stop. The inorganic layer 22 may be a polysilicon layer that is conformally deposited by low-pressure chemical vapor deposition (LPCVD).

FIGS. 1F-1G illustrate forming a plurality of multi-layer electrical interconnect networks 26 on respective SOI substrates 20, after active devices (e.g., CMOS devices, not shown) have been formed therein. Each of these multi-layer electrical interconnect networks 26 may include multiple layers of metallization and vertical interconnects within a stacked composite of multiple interlayer insulating layers 28. As shown by FIG. 1G, an interlayer dielectric layer (ILD) etching step may be performed to expose the anchors 24, which may be ring-shaped or formed as parallel stripes that extend in a third dimension (see, e.g., FIG. 1K), and also expose adjacent portions of the semiconductor active layer 14. The exposed portions of the semiconductor active layer 14 illustrated by FIG. 1G can then be exposed to a plasma etchant to thereby roughen the exposed upper surfaces of the semiconductor active layer 14. Plasmas that operate to etch silicon may utilize fluorine-containing gases (e.g., sulfur hexafluoride, $SF_6$). Alternatively, silicon may be removed from a surface of the active layer 14 by exposing the surface to a relatively inert gas containing argon ions, for example.

According to alternative embodiments of the invention (not shown), the intermediate structure illustrated by FIG. 1G may be achieved by providing an SOI substrate having active electronic devices (not shown) within the semiconductor active layer 14 and a plurality of multi-layer electrical interconnect networks on the active layer 14. The interlayer dielectric layers associated with the multi-layer electrically interconnect networks may then be selectively etched to expose the active layer 14 and then the active layer 14 and the sacrificial layer 12 may be selectively etched using a mask (not shown) to define a plurality of trenches having bottoms that expose the handling substrate 10. The trenches may then be filled with inorganic anchors prior to deposition of an inorganic capping layer.

Referring now to FIG. 1H, each of the plurality of multi-layer electrical interconnect networks 26 is encapsulated by depositing an inorganic capping layer 32 that contacts the roughened upper surfaces of the semiconductor active layer 14 to thereby form chemically impervious and etch resistant bonds (e.g., a hermetic seal) at the interface between the capping layer 32 and the roughened surfaces of the semiconductor active layer 14. The semiconductor capping layer 32 may be formed as an amorphous silicon layer or a metal layer. For example, an amorphous silicon capping layer may be deposited at a temperature of less than about 350° C. using a plasma-enhanced deposition technique.

Figure 1J:
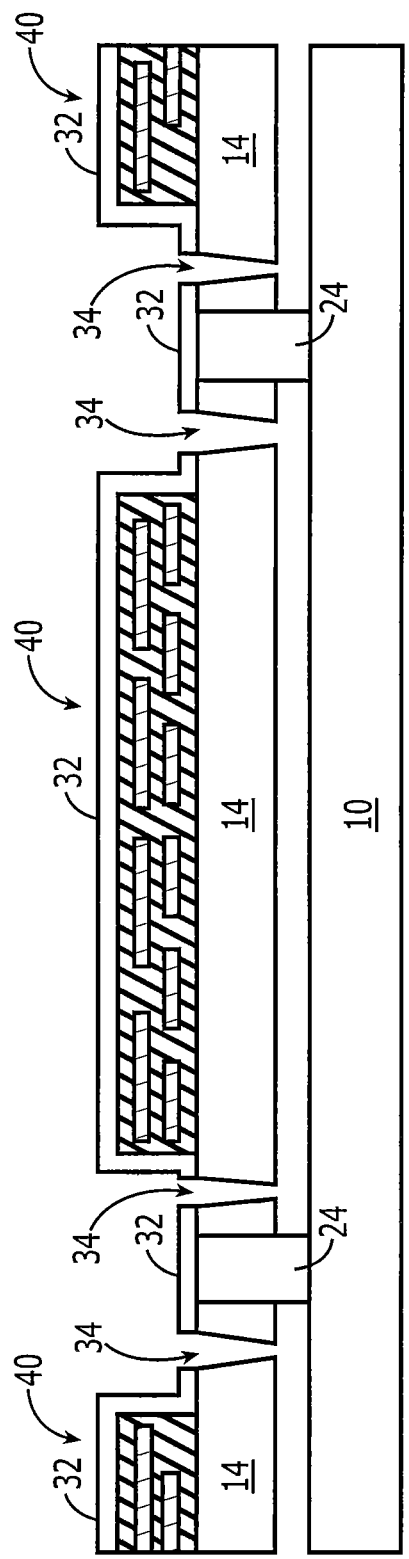
Figure 1K:
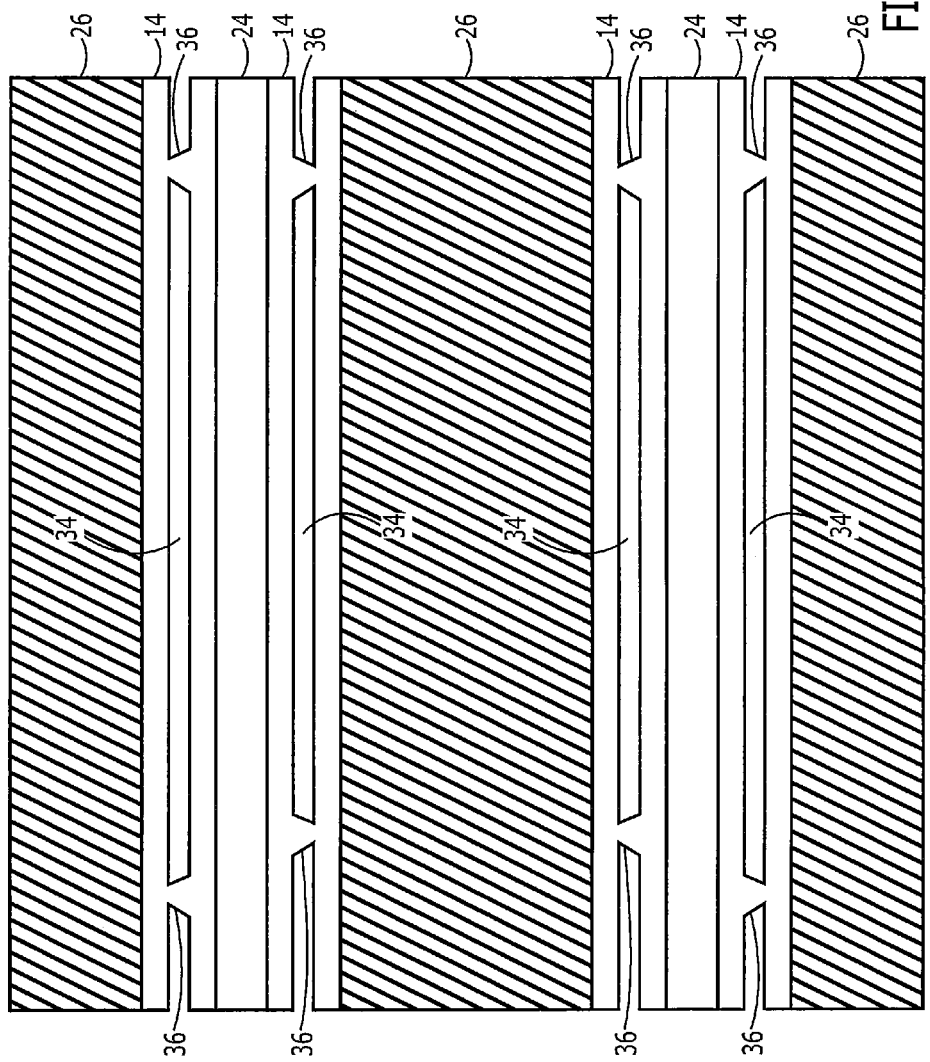
FIG. 1K is a plan view of an integrated circuit substrate having a plurality of integrated circuit chips therein, according to embodiments of the present invention.

FIG. 1I illustrates the formation of through-substrate openings 34 by selectively patterning of the capping layer 32 to define openings therein followed by the deep etching of the semiconductor active layer 14 to thereby expose underlying portions of the sacrificial layer 12 and define relatively thin supporting tethers 36 (see, e.g., FIG. 1K). Referring now to FIG. 1J, the sacrificial layer 12 is selectively removed from between the semiconductor active layer 14 and the handling substrate 10 to thereby define a plurality of suspended integrated circuit chips 40 which are individually encapsulated by the patterned capping layer 32. During this removal step, which may include exposing the intermediate structure of FIG. 1I to hydrofluoric acid (HF), the sidewalls of the anchors 24 may be exposed and the capping layer 32 may operate to protect the electrical interconnect networks 26 from chemical etchants. FIG. 1K is a plan view of an integrated circuit substrate of FIG. 1J (with capping layer 32 removed), which shows thin supporting tethers 36 extending between adjacent portions of the semiconductor active layer 14. These supporting tethers 36 enable each of the integrated circuit chips 40 to remain attached to the anchors 24. The patterned capping layer 32 may also be removed or remain as a passivating/protective layer.

Referring now to FIG. 2, methods of forming a plurality of functional layers according to some embodiments of the invention include depositing a sacrificial layer on a substrate (step 1) and then patterning the sacrificial layer (step 2) into a plurality of sacrificial patterns. A functional layer is then deposited (step 3) onto the plurality of sacrificial patterns. The functional layer is then patterned (step 4) to define openings therein. The sacrificial patterns are then removed (step 5) from underneath respective functional patterns. The functional patterns are then transferred to another substrate (step 6) by printing, for example.

Figure 3C:
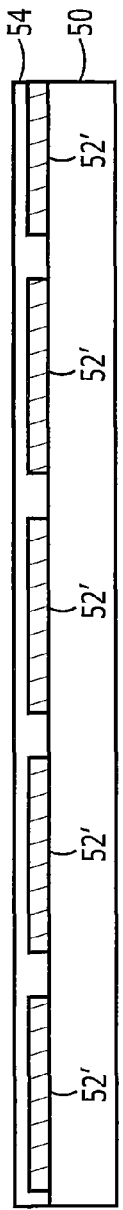

The methods of FIG. 2 are further illustrated by FIGS. 3A-3E, which are cross-sectional views of intermediate structures. These intermediate structures illustrate additional methods of forming substrates according to embodiments of the invention. FIG. 3A illustrates forming a sacrificial layer 52 on a handling substrate 50. The sacrificial layer 52 may be formed of an electrically conductive material such as molybdenum (Mo), aluminum (Al), copper (Cu), nickel (Ni), chromium (Cr), tungsten (W), titanium tungsten (TiW), titanium (Ti) or an electrically insulating material such as silicon dioxide, for example. The handling substrate 50 may be a semiconductor wafer, a glass substrate, or a ceramic board, for example. In some additional embodiments of the invention, a step may be performed to increase a roughness of an upper surface of the sacrificial layer 52 by exposing the upper surface to a chemical etchant for a sufficient duration to increase an average RMS roughness of the surface, prior to cleaning.

As illustrated by FIG. 3B, the sacrificial layer 52 is selectively etched using a mask (not shown) to define a plurality of spaced-apart sacrificial patterns 52' and expose portions of the underlying handling substrate 50, as illustrated. Referring now to FIG. 3C, a functional layer 54 is formed directly on upper surfaces of the plurality of spaced-apart sacrificial patterns 52' and directly on the exposed portions of the underlying handling substrate 50. The functional layer 54 may be formed as a semiconductor layer, such as a polysilicon layer, an amorphous silicon layer, a nanocrystalline silicon layer, or an indium gallium zinc oxide layer. The amorphous silicon layer may be formed using a plasma enhanced chemical vapor deposition (PECVD) technique. Alternatively, the polysilicon layer, amorphous silicon layer, nanocrystalline silicon layer or indium gallium zinc oxide layer may be formed using sputtering techniques.

Figure 3D:
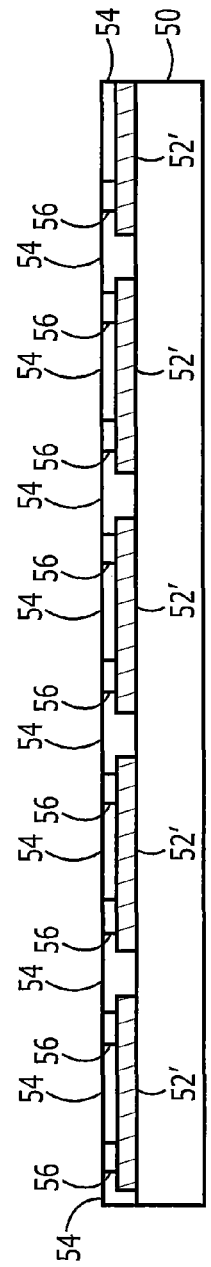
Figure 3E:
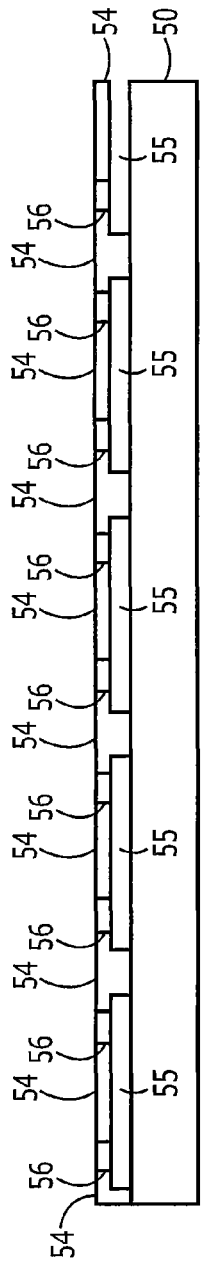

Referring now to FIG. 3D, a patterned functional layer 54 is defined by selectively etching the functional layer 54 of FIG. 3C using a mask (not shown), to define a plurality of openings 56 therein that expose respective portions of the underlying sacrificial patterns 52'. As illustrated by FIG. 3E, a selective etching step is performed to remove the sacrificial patterns 52' from underneath the patterned functional layer 54 and thereby define a plurality of underlying gaps or recesses 55. This selective etching step may include exposing the sacrificial patterns 52' to a chemical etchant that passes through the openings in the functional layer 54 and removes the sacrificial patterns 52'.

Figure 4B:
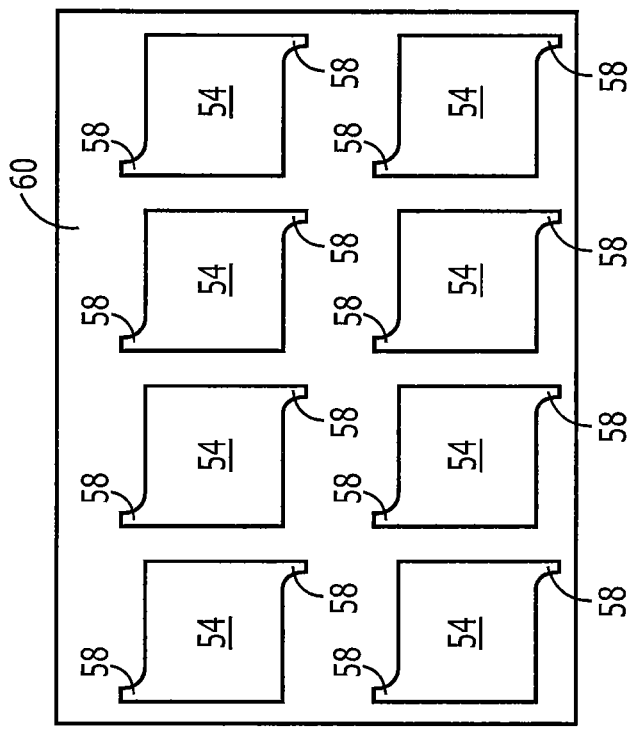
FIG. 4B is a plan view photograph of an array of substrates that have been printed according to embodiments of the invention.
Figure 4A:
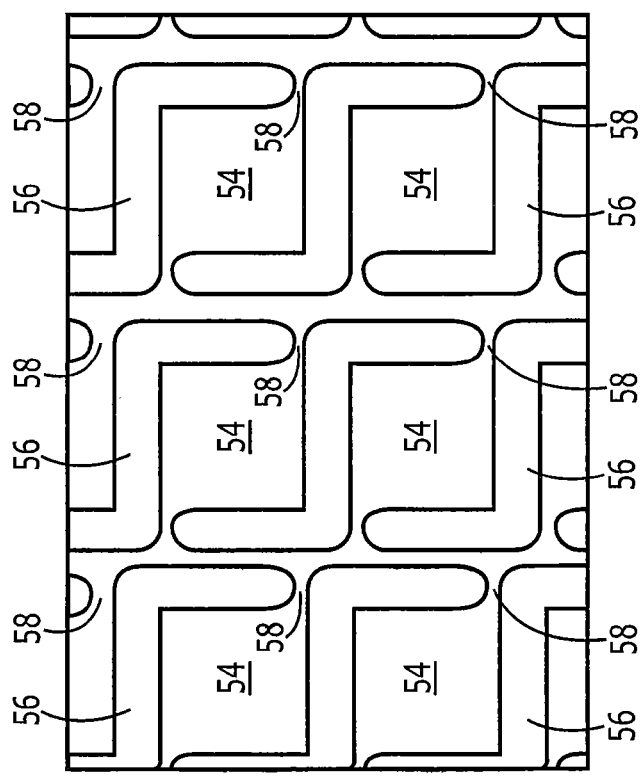
FIG. 4A is a plan view photograph of an array of suspended substrates according to embodiments of the invention.

As illustrated by FIG. 4A, the removal of the sacrificial patterns 52' may result in the formation of a plurality of suspended semiconductor device layers 54 that are attached by respective pairs of anchors 58 to a surrounding semiconductor layer. These anchors 58 are formed at diametrically opposite corners of the device layers 54, which are spaced apart from each other by respective openings 56. Referring now to FIG. 4B, the semiconductor device layers 54 may be printed at spaced-apart locations onto a second substrate 60 using a bonding technique. This printing step may also include fracturing the device layers 54 at the respective anchors 58 by removing the handling substrate 50 from the second substrate 60, so that the device layers 54 are provided at spaced locations on the second substrate 60.

Referring now to FIGS. 5 and 6A-6C, additional embodiments of the invention include depositing a sacrificial layer onto a first substrate 60 (step 1) and then patterning the sacrificial layer to define a plurality of openings therein (step 2) that extend between respective sacrificial patterns 62. A device layer 64 (e.g., amorphous semiconductor layer) is then deposited onto the patterned sacrificial layer and onto portions of the first substrate 60 exposed by the openings in the sacrificial layer (step 3). Portions of the device layer 64 are then treated by thermal and/or laser treatment. For example, in the event the device layer 64 is an amorphous silicon layer, then the portions of the device layer 64 extending opposite the plurality of spaced-apart sacrificial patterns 62 may be converted into respective semiconductor regions 65 having higher degrees of crystallinity therein relative to the surrounding amorphous silicon regions 64'.

The treated device layer 64 is then patterned (step 4) to define a plurality of openings 68 therein between amorphous silicon regions 64' and higher crystallinity regions 65'. These openings 68 expose respective ones of the plurality of spaced-apart sacrificial patterns 62. The sacrificial patterns 62 are then selectively etched through the openings (step 5) to thereby convert at least a first portion of the patterned device layer (e.g., amorphous semiconductor layer) into a plurality of suspended semiconductor device layers 65' that are anchored to a second portion of the patterned device layer 64'. As illustrated by FIGS. 4A-4B, a transfer printing step (step 6) may be performed to transfer the semiconductor device layers (as functional layers 54) to a second substrate 60.

FIGS. 7A-7B illustrate methods of forming printable thin-film transistor (TFT) substrates according to additional embodiments of the invention. As illustrated by FIGS. 7A-7B, a sacrificial pattern 75 is formed on a first substrate 70. A source electrode 76a and a drain electrode 76b are formed on the sacrificial pattern 75, as illustrated. A semiconductor layer 72 (e.g., a-Si) is formed on the source and drain electrodes, the sacrificial pattern 75 and the substrate 70, as illustrated. Thereafter, an electrically insulating layer 74 is formed on the semiconductor layer 72 and a gate electrode 76c is formed on the electrically insulating layer 74. The source, drain and gate electrodes 76a-76c collectively define the three terminals of a thin-film transistor having an active channel region defined within the semiconductor layer 72. The insulating layer 74 and semiconductor layer 72 are then selectively etched to define openings 78 therein. An etching step (e.g., wet etching) is then performed to remove the sacrificial patter 75 from underneath the source and drain electrodes 76a-76b and the semiconductor layer 72, as illustrated. A printing step may then be performed to print the gate electrode 76c and insulating layer 74 directly onto a second substrate (not shown) prior to removal of the first substrate 70. This printing step results in the formation of a thin-film transistor (TFT) having exposed source and drain electrodes 76a-76b.

FIGS. 8A-8B illustrate methods of forming printable thin-film transistor (TFT) substrates according to additional embodiments of the invention. As illustrated by FIG. 8A-8B, a sacrificial pattern 85 is formed on a first substrate 80. A gate electrode 86c is formed on the sacrificial pattern 85, as illustrated. An electrically insulating layer 82 is then formed on the gate electrode 86c, the sacrificial pattern 85 and the substrate 80, as illustrated. Thereafter, a semiconductor layer 84 (e.g., a-Si) is formed on the electrically insulating layer 82. Source and drain electrodes 86a-86b are formed on the semiconductor layer 84. The source, drain and gate electrodes 86a-86c collectively define the three terminals of a thin-film transistor having an active channel region defined within the semiconductor layer 84. The semiconductor layer 84 and insulating layer 82 are then selectively etched to define openings 88 therein. An etching step (e.g., wet etching) is then performed to remove the sacrificial patter 85 from underneath the gate electrode 86c and the insulating layer 82, as illustrated. A printing step may then be performed to print the source and drain electrodes 86a-86b and semiconductor layer 84 directly onto a second substrate (not shown) prior to removal of the first substrate 80. This printing step results in the formation of a thin-film transistor (TFT) having an exposed gate electrode 86c.

FIGS. 9A-9B illustrate methods of forming printable thin-film transistor (TFT) substrates according to additional embodiments of the invention. As illustrated by FIGS. 9A-9B, a sacrificial pattern 95 is formed on a first substrate 90. A semiconductor layer 92 (e.g., a-Si) is formed on the sacrificial pattern 95 and the first substrate 90, as illustrated. Thereafter, an electrically insulating layer 94 having an embedded gate electrode 96a therein is formed on the semiconductor layer 92. Source and drain electrodes 96b-96c are then formed on the insulating layer 94. These source and drain electrodes use source and drain electrode plugs 96b' and 96c', which extend through the electrically insulating layer 94, to contact the semiconductor layer 92, as illustrated. The insulating layer 94 and semiconductor layer 92 are then selectively etched to define openings 98 therein. An etching step (e.g., wet etching) is then performed to remove the sacrificial patter 95 from underneath the semiconductor layer 92, as illustrated. A printing step may then be performed to print the source and drain electrodes 96b-96c and insulating layer 94 directly onto a second substrate (not shown) prior to removal of the first substrate 90. This printing step results in the formation of a thin-film transistor (TFT) having buried source and drain electrodes 96b-96c.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A wafer of integrated circuit devices, comprising:
   a substrate;
   a plurality of integrated circuits, each integrated circuit suspended entirely over a gap between the respective integrated circuit and the substrate and comprising a semiconductor active layer;

one or more multi-layer electrical interconnect networks, each multi-layer electrical interconnect network disposed on the semiconductor active layer of a corresponding integrated circuit;
a plurality of anchors disposed on the substrate and separated by the gaps, each anchor disposed adjacent to at least one integrated circuit; and
a plurality of tethers, each tether extending between at least one of the integrated circuits and at least one of the anchors to attach the integrated circuits to the anchors.

2. The wafer of claim 1, wherein each of the integrated circuits is encapsulated by an inorganic capping layer.

3. A wafer of integrated circuit devices, comprising:
a substrate;
a plurality of integrated circuits, each integrated circuit comprising a semiconductor active layer;
one or more multi-layer electrical interconnect networks, each multi-layer electrical interconnect network disposed on the semiconductor active layer of a corresponding integrated circuit;
a plurality of anchors disposed on the substrate, each anchor disposed adjacent to at least one integrated circuit, wherein the plurality of anchors are inorganic semiconductor anchors; and
a plurality of tethers, each tether extending between at least one of the integrated circuits and at least one of the anchors.

4. The wafer of claim 1, wherein each multi-layer electrical interconnect network comprises a plurality of interlayer dielectric layers.

5. The wafer of claim 1, wherein the plurality of tethers comprises a semiconductor active layer with a plurality of openings formed therein.

6. The wafer of claim 1, wherein a surface, opposite the substrate, of each anchor, a surface, opposite the substrate, of each tether, and a surface, opposite the substrate, of each semiconductor active layer are in a common plane.

7. The wafer of claim 1, wherein the each integrated circuit comprises one or more thin-film transistors.

8. The wafer of claim 1, comprising a patterned sacrificial layer disposed on the substrate, wherein the semiconductor active layer of each of the plurality of integrated circuits is disposed on the patterned sacrificial layer.

9. A wafer of integrated circuit devices, comprising:
a substrate;
a plurality of integrated circuits, each integrated circuit comprising a semiconductor active layer;
one or more multi-layer electrical interconnect networks, each multi-layer electrical interconnect network disposed on the semiconductor active layer of a corresponding integrated circuit;
a plurality of anchors disposed on the substrate, each anchor disposed adjacent to at least one integrated circuit; and
plurality of tethers, each tether extending between at least one of the integrated circuits and at least one of the anchors, wherein the plurality of tethers and the semiconductor active layer of each of the integrated circuits collectively are formed of a patterned semiconductor layer.

10. The wafer of claim 9, wherein the patterned semiconductor layer comprises a plurality of openings that extend from a first surface of the patterned semiconductor layer to a second surface of the patterned semiconductor layer.

11. The wafer of claim 10, wherein the plurality of openings define the plurality of tethers.

12. A wafer of integrated circuit devices, comprising:
a substrate;
a patterned sacrificial layer on the substrate;
a patterned semiconductor active layer on the patterned sacrificial layer; and
a patterned field oxide layer on the patterned semiconductor layer, a plurality of integrated circuits, each integrated circuit comprising a semiconductor-on-insulator substrate collectively defined by the patterned sacrificial layer, the patterned semiconductor layer, and the patterned field oxide layer collectively;
one or more anchors on the substrate;
a plurality of tethers, wherein each integrated circuit is connected to at least one of the one or more anchors by one or more tethers;
a plurality of multi-layer electrical interconnect networks, wherein one or more multi-layer electrical interconnect networks is disposed on the active semiconductor layer of each respective integrated circuit, and
a patterned capping layer at least partially on the multi-layer electrical interconnect networks, an upper surface of the semiconductor active layers, and a surface of the anchors to thereby define a plurality of suspended integrated circuits that are individually encapsulated by the patterned capping layer.

13. The wafer of claim 12, wherein the sacrificial layer is a space over which the integrated circuits are suspended by the one or more tethers.

14. The wafer of claim 12, wherein the plurality of anchors are inorganic semiconductor anchors.

15. The wafer of claim 12, wherein each multi-layer electrical interconnect network comprises a plurality of interlayer dielectric layers.

16. The wafer of claim 12, wherein the plurality of tethers comprises a semiconductor active layer with a plurality of openings formed therein.

17. The wafer of claim 12, wherein a surface, opposite the substrate, of each anchor, a surface, opposite the substrate, of each tether, and a surface, opposite the substrate, of each semiconductor active layer are in a common plane.

18. The wafer of claim 12, wherein the each integrated circuit comprises one or more thin-film transistors.

19. The wafer of claim 12, comprising a patterned sacrificial layer disposed on the substrate, wherein the semiconductor active layer of each of the plurality of integrated circuits is disposed on the patterned sacrificial layer.

20. The wafer of claim 12, wherein:
the plurality of tethers and the semiconductor active layer of each of the integrated circuits collectively are formed of a patterned semiconductor layer;
the patterned semiconductor layer comprises a plurality of openings that extend from a first surface of the patterned semiconductor layer to a second surface of the patterned semiconductor layer; and
the plurality of openings define the plurality of tethers.

* * * * *